United States Patent
Peng et al.

(10) Patent No.: US 10,810,337 B2
(45) Date of Patent: Oct. 20, 2020

(54) METHOD FOR MODELING GLITCH OF LOGIC GATES

(71) Applicant: MediaTek Singapore Pte. Ltd., Singapore (SG)

(72) Inventors: Jeff Chijung Peng, San Jose, CA (US); Jiu-Shang Yang, San Jose, CA (US); Shang-Wei Tu, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 17 days.

(21) Appl. No.: 16/123,017

(22) Filed: Sep. 6, 2018

(65) Prior Publication Data

US 2019/0138677 A1    May 9, 2019

Related U.S. Application Data

(60) Provisional application No. 62/581,111, filed on Nov. 3, 2017.

(51) Int. Cl.
| | |
|---|---|
| *G06F 30/33* | (2020.01) |
| *G06F 30/327* | (2020.01) |
| *G06F 30/367* | (2020.01) |
| *G06F 30/392* | (2020.01) |
| *G06F 30/398* | (2020.01) |

(52) U.S. Cl.
CPC ............ *G06F 30/33* (2020.01); *G06F 30/327* (2020.01); *G06F 30/367* (2020.01); *G06F 30/392* (2020.01); *G06F 30/398* (2020.01)

(58) Field of Classification Search
CPC ....... G06F 30/33; G06F 30/392; G06F 30/367
USPC .......................................... 716/112
See application file for complete search history.

(56) References Cited

U.S. PATENT DOCUMENTS

| | | | |
|---|---|---|---|
| 7,877,710 B1 * | 1/2011 | Neto ................. | G06F 30/30 716/100 |
| 2001/0028269 A1 * | 10/2001 | Shuler, Jr. ............ | H03K 3/0375 327/277 |

* cited by examiner

*Primary Examiner* — Suresh Memula
(74) *Attorney, Agent, or Firm* — McClure, Qualey & Rodack, LLP

(57) ABSTRACT

A method for modeling glitch of a logic gate is provided. An input glitch with a glitch width is obtained from the logic gate. The glitch width is scaled by a first scaling factor when the glitch width is greater than or equal to a first threshold width. The glitch width is scaled by a second scaling factor when the glitch width is less than the first threshold width and greater than or equal to a second threshold width. An output glitch with the scaled glitch width is provided for the logic gate. The scaled glitch width is greater than 0. The first threshold width is greater than the second threshold width, and the second scaling factor is smaller than the first scaling factor.

10 Claims, 13 Drawing Sheets

| Condition | Scaling Factor |
|---|---|
| Glitch width ≧ 50ps (TH_H) | 1 (Fully Propagate) |
| 5ps ≦ Glitch width < 50ps | 0.9 (Decay) |
| Glitch width < 5ps (TH_L) | 0 (Filter Out) |

FIG. 7A

| Stage | input glitch width (ps) | output glitch width (ps) | Scaling factor |
|---|---|---|---|
| 1 | 41.0 | 36.9 | |
| 2 | 36.9 | 33.2 | |
| 3 | 33.2 | 29.8 | 0.9 |
| ⋮ | ⋮ | ⋮ | |
| N | 5.0 | 4.5 | |
| N+1 | 4.5 | 0.0 | 0.0 |
| N+2 | 0.0 | 0.0 | |

FIG. 7B

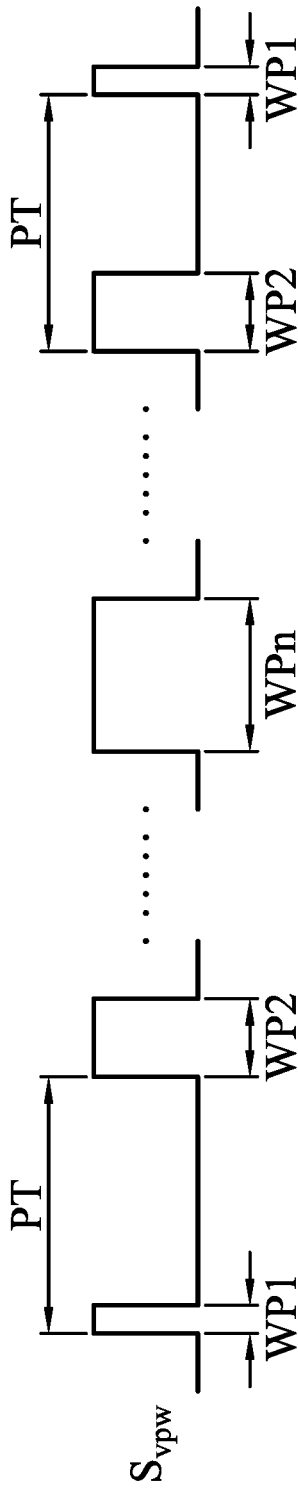
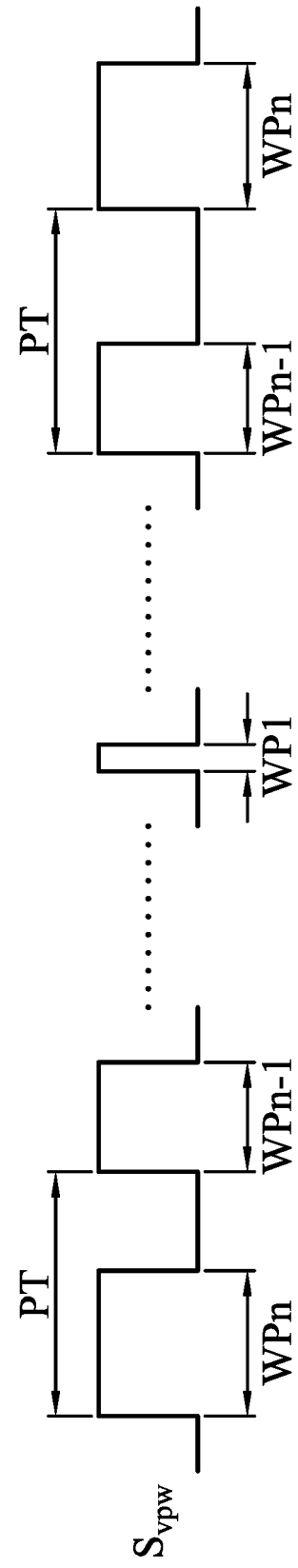
FIG. 10A
FIG. 10B

METHOD FOR MODELING GLITCH OF LOGIC GATES

CROSS REFERENCE TO RELATED APPLICATIONS

This application claims priority of U.S. Provisional Application No. 62/581,111, filed on Nov. 3, 2017, the entirety of which is incorporated by reference herein.

BACKGROUND OF THE INVENTION

Field of the Invention

The invention relates to a method for modeling glitches of logic gates, and more particularly to a method for modeling glitches using a glitch scaler in a logic simulation.

Description of the Related Art

In integrated circuit (IC) designs, power has been given comparable weight as other design metrics—performance, silicon area, and schedule. The market demands high-speed computation with low power consumption to extend the battery life in mobile devices. But even for products that are not battery-operated, power is still a key concern for circuit reliability, cost of packaging, and cooling solutions. Hence, power has become the common constraint to all silicon designs.

Nowadays, pre-silicon estimates rely on power simulation tools. A circuit simulation can provide the most accurate results when making silicon measurements, but the runtime and capacity can no longer support the complexity of SoCs. Currently, the practical solution is to utilize a logic simulation/emulation tool along with a power calculator, to get a reasonable runtime and quality results for power estimation.

Based on designs, the glitch power can cause significant power miscorrelation between the pre-silicon power estimation and the post-silicon measurement. This is because a power simulation tool consumes the waveforms generated by a logic simulator for the power calculation.

Therefore, methods for accurately modeling the analog behaviors of glitches with a logic simulator are desired.

BRIEF SUMMARY OF THE INVENTION

An embodiment of a method for modeling glitch of a logic gate is provided. An input glitch with a glitch width is obtained from the logic gate. The glitch width is scaled by a first scaling factor when the glitch width is greater than or equal to a first threshold width. The glitch width is scaled by a second scaling factor when the glitch width is less than the first threshold width and greater than or equal to a second threshold width. An output glitch with the scaled glitch width is provided for the logic gate. The scaled glitch width is greater than 0. The first threshold width is greater than the second threshold width, and the second scaling factor is smaller than the first scaling factor.

Furthermore, another embodiment of a method for modeling glitch for a logic gate. A glitch is obtained from an input of the logic gate. The glitch is fully propagated to an output of the logic gate when a glitch width of the glitch is greater than or equal to a first threshold width. The glitch is filtered out at the output of the logic gate when the glitch width of the glitch is less than a second threshold width. The glitch is decayed at the output of the logic gate when the glitch width of the glitch is less than the first threshold width and greater than or equal to the second threshold width.

Moreover, another embodiment of a method for modeling glitch for a logic gate is provided. A signal with a plurality of variable pulse widths is input to a multiple-stage chain formed by a plurality of logic gates coupled in a chain according to a first set of glitch parameters, so as to perform a logic simulation on the multiple-stage chain, wherein the logic gates are identical cells, and the variable pulse widths are different. A first toggle count corresponding to the first set of glitch parameters is obtained at an output of each stage of the logic gates in the multiple-stage chain. A first toggle count result is obtained according to the first toggle counts of the logic gates in the multiple-stage chain. The first set of glitch parameters is used to perform a logic simulation on the logic gates of an integrated circuit (IC) when the first toggle count result is close to a target toggle count.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 7A shows an example table illustrating a set of glitch parameters of a logic gate according to an embodiment of the invention;

FIG. 7B shows an example table illustrating the input glitch width and the output glitch width of each stage of a multiple-stage chain formed by a plurality of logic gates coupled in a chain according to an embodiment of the invention;

FIG. 10A shows a waveform of the variable pulse width signal according to an embodiment of the invention;

FIG. 10B shows a waveform of the variable pulse width signal according to another embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
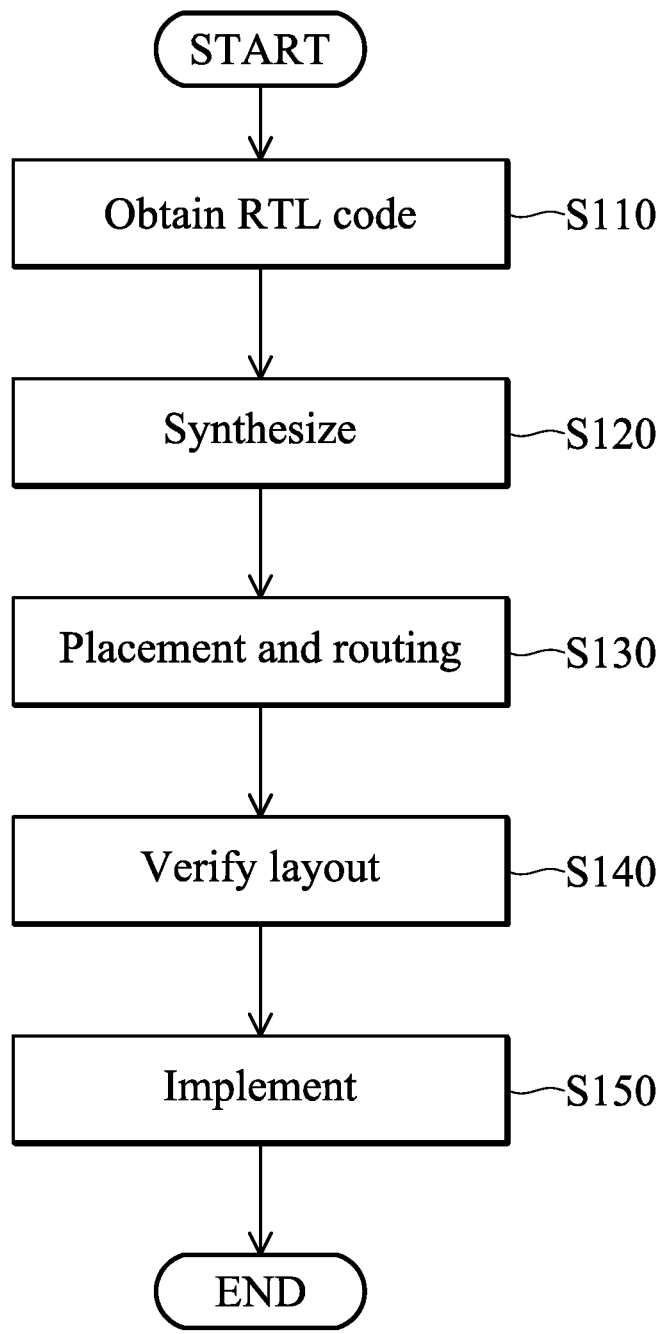
FIG. 1 shows a flow chart illustrating a hierarchical design process of an integrated circuit (IC)

FIG. 1 shows a flow chart illustrating a hierarchical design process of an integrated circuit (IC). In step S110, a register-transfer level (RTL) code describing the function performed by the IC is obtained. The RTL code may indicate that a design is performed using a language describing hardware, such as a Hardware Description Language (HDL). In step S120, the RTL code is synthesized to generate a netlist comprising gates (or cells) of the IC. In general, the IC comprises a plurality of blocks, and each block provides a significant function for the IC, such as a specific processor (e.g. an application processor, a video processor, an audio processor, or a controller), a memory (e.g. a SRAM device) and so on. Furthermore, each block has a corresponding RTL code, and then the RTL code of each block is synthesized to generate the corresponding netlist comprising the gates of the block. Before the RTL code is synthesized, a RTL simulation is performed to check the functional correctness of the RTL code. Furthermore, after obtaining the gates of the block in the netlists, a gate level simulation is performed to check the functional correctness of the netlists. In step S130, according to the gates of the blocks in the netlists, a placement and routing procedure is performed to generate a layout of whole blocks within a chip area of the IC. Thus, according to the placements, a chip placement and routing procedure is performed and a layout is obtained. In some embodiments, the layout is a whole chip layout. In some embodiments, the layout is a portion of a whole chip layout regarding some digital circuits of the IC. In step S140, an analysis procedure is performed and the layout is verified to check whether the layout violates any of the various constraints or rules. After the layout is completed, design rule check (DRC), layout versus schematic (LVS) and electric rule check (ERC) are performed. The DRC is a process of checking whether the layout is successfully completed with a physical measure space according to the design rule, and the LVS is a process of checking whether the layout meets a corresponding circuit diagram. In addition, the ERC is a process of for checking whether devices and wires/nets are electrically well connected therebetween. Furthermore, a post-simulation is performed to check the functional completeness of the layout by extracting and simulating a parasitic component, such as a parasitic capacitance. If there are no violations in the layout, the IC is fabricated (or implemented) according to the layout (step S150). If a violation is present in the layout, the layout of the IC must be modified to handle the violation until no violations are present.

For an IC, a glitch is an unexpected pulse which consumes extra power and may cause functional failure. There are two types of glitches: transport glitch and inertial glitch.

The transport glitch is a pulse which will be completely or partially propagated to next stage of logic gate (or cell), and it may be caused by unbalanced input skews in combinational logic gates.

The inertial glitch is a pulse which will not be propagated to the next stage of logic gate, and it may be induced by the cross-talk or unbalanced input skews which is insignificant to be propagated for a logic gate. In general, the inertial glitch will be filtered out at the output of logic gate, i.e., no inertial glitch is present at the output of logic gate.

At logic level, a logic simulator is used to provide logic simulation for signal activities and propagations. Furthermore, the ideal slope is used in the logic simulation, for example, the square waveform with 0 transition time. Therefore, based on the pulse duration (or pulse width) of a glitch, the glitch will be filtered at a logic gate (e.g., the logic simulator completely filters out the glitch at the logic gate when the pulse width of the glitch is less than a cell delay of the logic gate), or the glitch will be propagated downstream to sequential logic gates, e.g., the logic simulator fully propagates the glitch to the sequential logic gates when the pulse width of the glitch exceeds the cell delay of the logic gate.

Figure 2:
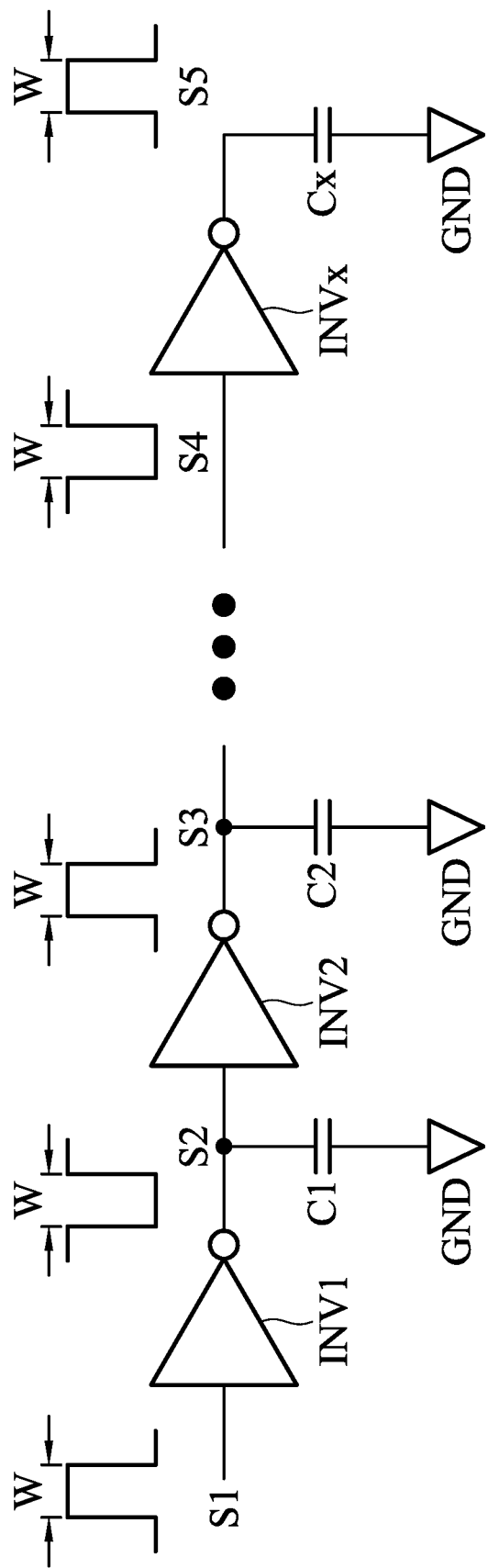
FIG. 2 shows an example illustrating the waveforms of signals at the logic gates obtained by a conventional logic simulator.

FIG. 2 shows an example illustrating the waveforms of signals at the logic gates obtained by a conventional logic simulator. In FIG. 2, a plurality of inverters INV1-INVx are coupled in a chain. For example, an output terminal of the inverter INV1 is coupled to an input terminal of the inverter INV2. Furthermore, a capacitor C1 is coupled between a ground GND and a node between the inverters INV1 and INV2, and the capacitor C1 may be a parasitic capacitor between the inverters INV1 and INV2. Furthermore, the inverters INV1-INVx are identical, i.e., the inverters INV1-INVx have the same design, characteristic and structure. As shown in FIG. 2, if a signal S1 having a glitch width W is input to the inverter INV1, the logic simulator will reverse the signal S1 to provide a signal S2 as an output of the inverter INV1. Due to the glitch width W is greater than a cell delay of the inverters INV1-INVx, the glitch is fully propagated to the output of the inverter INV1. Thus, the signal S2 having the glitch width W is input to the inverter INV2, and so on. Therefore, the glitch of the signal S1 sequentially passes through the inverters INV1-INVx, as shown in the signals S2-S5, and the power caused by the glitch propagated to inverter INVx from inverter INV1 is obvious. However, the obvious power does not meet the actual situation.

At the circuit level, based on the pulse duration (or pulse width) of a glitch, a circuit simulation performed by a circuit simulator is capable of providing 3 propagation types of glitch: the full-propagation type, the no-propagation type, and the scaled-propagation type.

In the full propagation type, the circuit simulator is capable of providing a glitch with full swing at the output of the logic gate. The full-propagation type can also be modeled in a logic simulator if the glitch width (or the pulse width) is greater than or equal to the threshold width, such as the cell delay of the logic gate. Thus, in the logic simulator, the glitch will fully propagate from the input terminal to the output terminal of the logic gate based on the timing model of the logic gate.

In the no-propagation type, the circuit simulator is capable of completely filtering out the glitch at the output of the logic gate. The no-propagation type can also be modeled in the logic simulator if the glitch width (or the pulse width) is less than the threshold width. Thus, in the logic simulator, no glitch is present based on the timing model of the logic gate.

Figure 3:
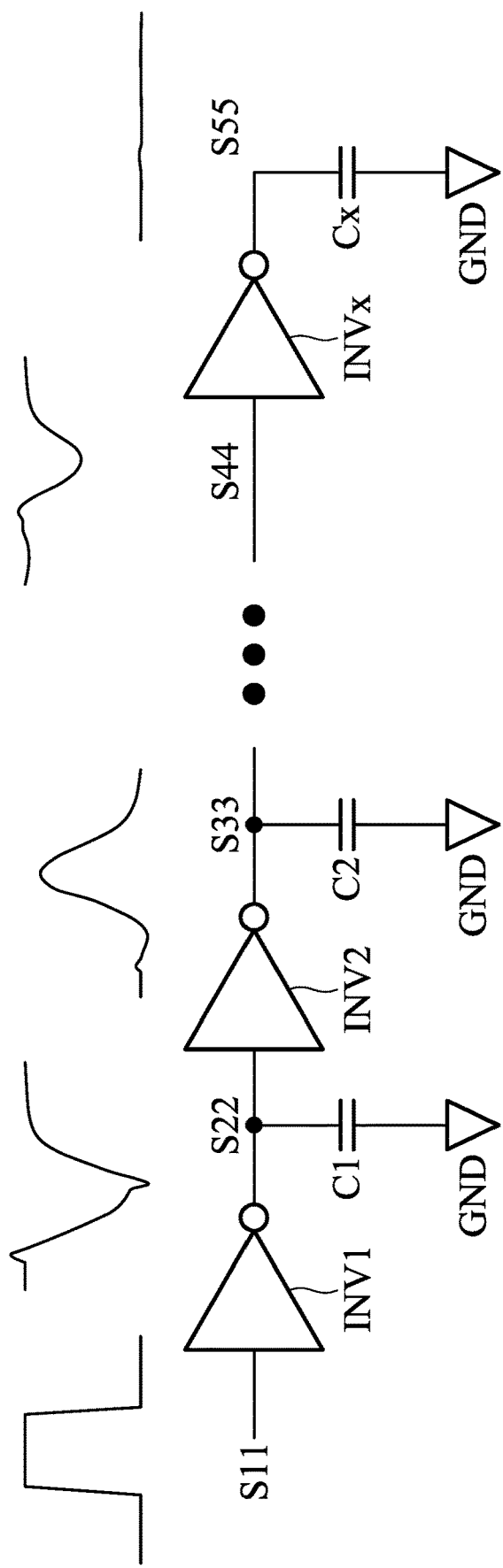
FIG. 3 shows an example illustrating the waveforms of signals at the logic gates obtained by a circuit simulator.

In the scaled-propagation type, the circuit simulator is capable of decreasing the glitch width at the output of logic gate base on the analog circuit behavior of the logic gate. As shown in FIG. 3, FIG. 3 shows an example illustrating the waveforms of signals at the logic gates obtained by a circuit simulator. In FIG. 3, the inverters INV1-INVx are coupled in a chain, and the inverters INV1-INVx are identical. As shown in FIG. 3, in response to a signal S11 with a glitch width W being input to the inverter INV1, the circuit simulator will provide a signal S2 with a decreasing glitch width as the output of the inverter INV1. With the decrease of the glitch width, the glitch is absent from the output terminal of the inverter INVx. Therefore, the glitch of the signal S1 will not be propagated to inverter INVx from inverter INV1. In FIG. 3, the power caused by the glitch propagated from inverter INV1 is less than the power the power caused by the glitch propagated to inverter INVx from inverter INV1 in FIG. 2, and is more realistic. However, the scaled-propagation type cannot be modeled in conventional logic simulators.

Figure 4:
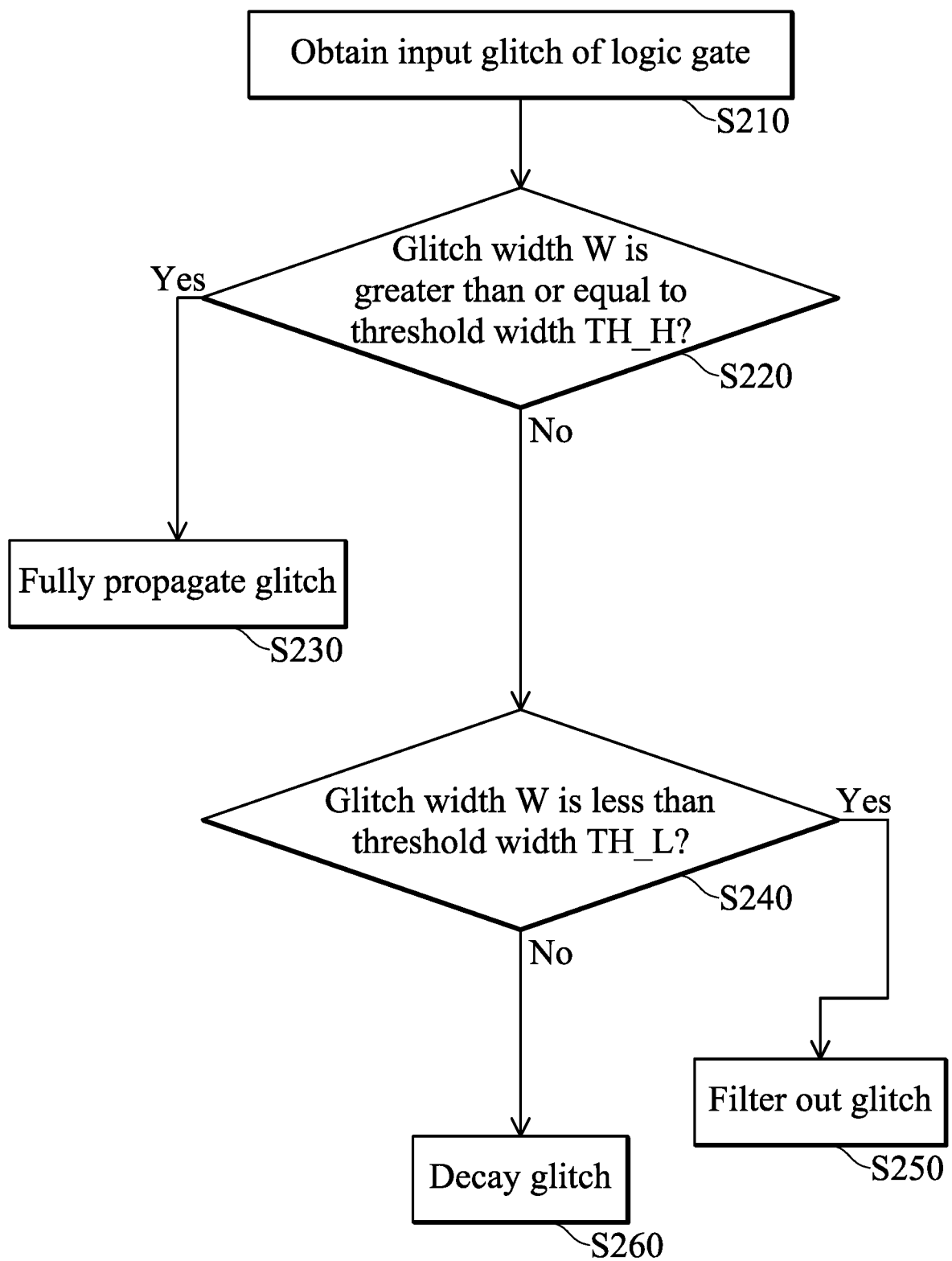
FIG. 4 shows a flowchart of a method for modeling glitch of a logic gate according to an embodiment of the invention, wherein the method of FIG. 4 is performed by a glitch scaler at logic level.

FIG. 4 shows a flowchart of a method for modeling glitch of a logic gate according to an embodiment of the invention, wherein the method of FIG. 4 is performed by a glitch scaler at logic level. In some embodiments, the glitch scaler is implemented by a computer capable of operating an electronic design automation (EDA) tool (e.g., a logic simulator).

First, in step S210, the glitch scaler obtains an input glitch of a logic gate. The input glitch is present in an input of the logic gate, and the input glitch has a glitch width W.

In step S220, the glitch scaler determines whether the glitch width W of the input glitch is greater than or equal to a threshold width TH_H (i.e., W≥TH_H).

If the glitch width W is greater than or equal to the threshold width TH_H, the glitch scaler fully propagates the input glitch to an output of the logic gate (step S230), so as to provide an output glitch with the glitch width W. In other words, the glitch scaler uses a scaling factor of 1 to scale the glitch width W (e.g., W×1), thus the input glitch and the output glitch have the same glitch width W.

If the glitch width W is less than the threshold width TH_H, the glitch scaler further determines whether the glitch width W of the input glitch is less than a threshold width TH_L (step S240), i.e., W<TH_L.

If the glitch width W is less than the threshold width TH_L, the glitch scaler filters out the input glitch (S250), thus no output glitch is present at the output of the logic gate. In other words, the glitch scaler uses a scaling factor of 0 to scale the glitch width W (e.g., W×0), thus the input glitch will not be propagated to the output of the logic gate.

If the glitch width W is greater than or equal to the threshold width TH_L, the glitch scaler decreases (or decays) the glitch width W (step S260), so as to provide an output glitch with the decreased glitch width W. In other words, the glitch scaler uses a scaling factor between 1 and 0 to scale the glitch width W, thus the output glitch is smaller than the input glitch. Therefore, by using the glitch scaler, the glitch width W between the threshold widths TH_H and TH_L will get scaled down to mimic a glitch decaying effect that can be extended for better fitting to analog circuit behavior.

In some embodiments, when the glitch width W is less than the threshold width TH_H and greater than or equal to the threshold width TH_L (e.g., TH_L≤W<TH_H), the glitch scaler can use various scaling factors between 1 and 0 to scale the glitch width W. For example, if the glitch width W is less than a threshold width TH_1 and greater than or equal to the threshold width TH_L (e.g., TH_L≤W<TH_1), the glitch scaler uses a first scaling factor between 1 and 0 to scale the glitch width W. If the glitch width W is less than a threshold width TH_2 and greater than or equal to the threshold width TH_1 (e.g., TH_1≤W<TH_2), the glitch scaler uses a second scaling factor between 1 and the first scaling factor, to scale the glitch width W. Thus, the output glitch corresponding to the second scaling factor is greater than the output glitch corresponding to the first scaling factor. Similarly, if the glitch width W is less than a threshold width TH_3 and greater than or equal to the threshold width TH_2 (e.g., TH_2≤W<TH_3), the glitch scaler uses a third scaling factor between 1 and the second scaling factor, to scale the glitch width W. Thus, the output glitch corresponding to the third scaling factor is greater than the output glitch corresponding to the second scaling factor. Furthermore, if the glitch width W is less than the threshold width TH_H and greater than or equal to the threshold width TH_3 (e.g., TH_3≤W<TH_H), the glitch scaler uses a fourth scaling factor between 1 and the third scaling factor, to scale the glitch width W. Thus, the output glitch corresponding to the fourth scaling factor is greater than the output glitch corresponding to the third scaling factor. It should be noted that the glitch scaler can model the glitch closer to the analog circuit behavior of the logic gate according to a plurality of scaling factors.

In a logic simulation, by using the glitch scaler to model the glitch for each logic gate of the circuits in an IC, the functional correctness and power estimation of the circuits will be more accurate, for example, similar to analog circuit behavior. As described above, after the functions of the logic gates are verified, a plurality of standard cells corresponding to the logic gates are placed to obtain a layout of the IC, and the IC is fabricated based on the layout of the IC. Furthermore, the power miscorrelation issue between pre-silicon simulation (e.g., a post-simulation of the IC) and real silicon measurement on the fabricated IC is decreased.

Figure 5:
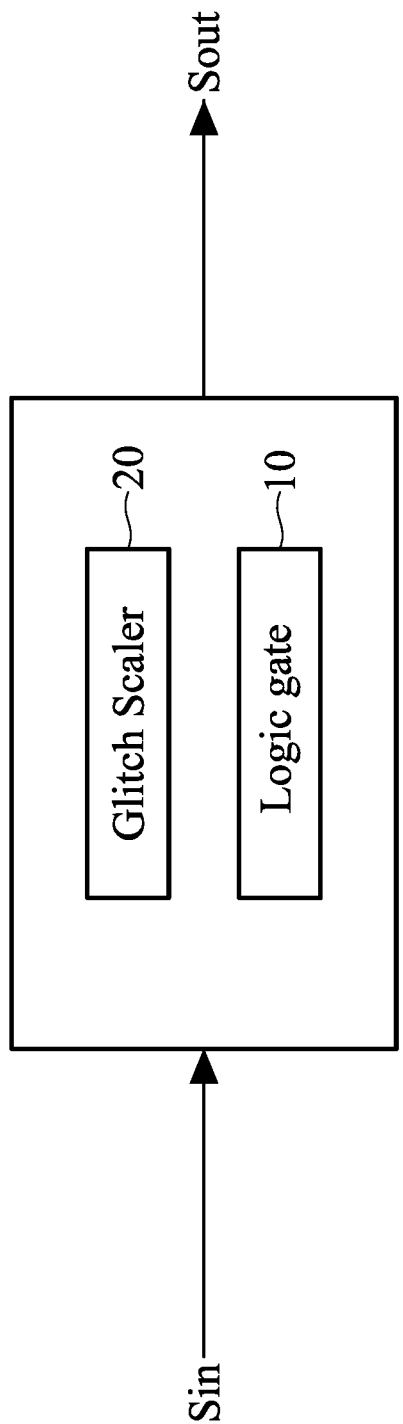
FIG. 5 shows a schematic illustrating a glitch scaler according to an embodiment of the invention.

FIG. 5 shows a schematic illustrating a glitch scaler 20 according to an embodiment of the invention. The glitch scaler 20 is capable of modeling a glitch for a logic gate 10. The logic gate 10 may be an inverter, a buffer, a NAND gate, a NOR gate, a AND gate, an OR gate, a XOR gate, or a XNR gate. A signal Sin is an input signal to be input to the logic gate 10, and a signal Sout is an output signal provided by the logic gate 10 in response to the signal Sin. At logic level, the logic gate 10 determines the output signal Sout based on the logic function of the logic gate 10 after the logic gate 10 obtains the input signal Sin. For example, assuming that the logic gate 10 is an inverter, the logic gate 10 will reverse the input signal Sin to obtain the output signal Sout based on the logic function of the inverter.

The glitch scaler 20 monitors the input signal Sin to detect whether a glitch is present in the input signal Sin. For example, the glitch scaler 20 detects a pair of positive edge and negative edge, so as to obtain a pulse of the input signal Sin. Next, the glitch scaler 20 determines whether the pulse is a glitch based on the rise-delay (Trise) and fall-delay (Tfall) values of the logic gate. If the pulse is a glitch, according to the glitch width of the glitch, the glitch scaler 20 determines the glitch width to be output according to the various thresholds and various scaling factors, for example, the whole glitch, a portion of the glitch or no glitch passes through the glitch scaler 20 to the output signal Sout. Thus, when output of the logic gate starts transitioning, the glitch scaler 20 forces the output at the right moment to produce the output glitch.

Figure 6A:
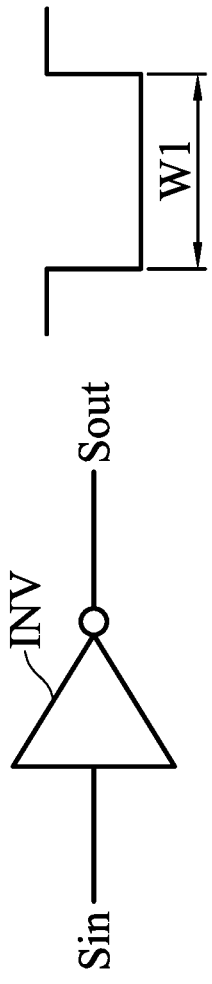
FIG. 6A shows an example illustrating a full-propagation glitch type according to an embodiment of the invention.

FIG. 6A shows an example illustrating a full-propagation glitch type according to an embodiment of the invention. The input signal Sin is input to an inverter INV1, and the input signal Sin has an input glitch with a glitch pulse width W1. As described in step S230 of FIG. 4, if the glitch pulse width W1 is greater than or equal to the threshold TH_H (e.g., W1≥TH_H), the glitch scaler 20 of FIG. 5 fully propagates the glitch pulse width W1 to the output signal Sout of the inverter INV. Thus, the input signal Sin and the output signal Sout have the same glitch pulse width W1.

Figure 6B:
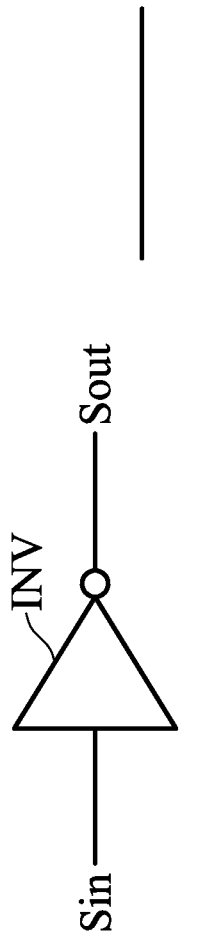
FIG. 6B shows an example illustrating a filtered-out glitch type according to an embodiment of the invention.

FIG. 6B shows an example illustrating a filtered-out glitch type according to an embodiment of the invention. In FIG. 6B, the input signal Sin of FIG. 6B has an input glitch with a glitch pulse width W2. As described in step S250 of FIG. 4, if the glitch pulse width W2 is less than the threshold TH_L (e.g., W2<TH_L), the glitch scaler 20 of FIG. 5 filters out the glitch pulse width W2. Thus, no glitch is present in the output signal Sout.

Figure 6C:
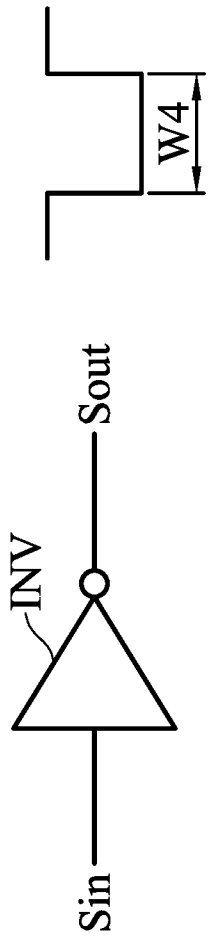
FIG. 6C shows an example illustrating a decreased glitch type according to an embodiment of the invention.

FIG. 6C shows an example illustrating a decreased (or decayed) glitch type according to an embodiment of the invention. In FIG. 6C, the input signal Sin of FIG. 6C has an input glitch with a glitch pulse width W3. As described in step S260 of FIG. 4, if the glitch pulse width W3 is less than the threshold TH_H and greater than or equal to the threshold TH_L (e.g., TH_L≤W3<TH_H), the glitch scaler 20 of FIG. 5 decreases the glitch pulse width W3 to provide a glitch pulse width W4 to the output signal Sout. Thus, the glitch pulse width W4 of the output signal Sout is less than the glitch pulse width W3 of the input signal Sin, i.e., a glitch decaying effect.

FIG. 7A shows an example table illustrating a set of glitch parameters of a logic gate according to an embodiment of the invention. If the glitch width of the input signal Sin is greater than or equal to 50 ps (i.e. the threshold TH_H=50 ps), the scaling factor is 1, and the glitch width is fully propagated to the output signal Sout. If the glitch width of the input signal Sin is less than 5 ps (i.e. the threshold TH_H=5 ps), the scaling factor is 0, and the glitch width is filtered out in the output signal Sout. If the glitch width of the input signal Sin is between 5 ps and 50 ps, the scaling factor is 0.9.

In some embodiments, the logic gates corresponding to the same logic function can have individual glitch parameters. For example, the first inverter INVX1, the second inverter INVX2, and the third inverter INVX4 have the same logic function with different driving capabilities, and the first inverter INVX1 has a first set of glitch parameters, the second inverter INVX2 has a second set of glitch parameters, and the third inverter INVX4 has a third set of glitch parameters. The threshold widths TH_H and TH_L and the scaling factors are different in the first, second and third sets of glitch parameters.

FIG. 7B shows an example table illustrating the input glitch width and the output glitch width of each stage of a multiple-stage chain formed by a plurality of logic gates coupled in a chain according to an embodiment of the invention. For each stage of logic gate, the output glitch width is obtained according to the glitch parameters of FIG. 7A. In the table of FIG. 7B, from the $1^{st}$ stage to the $N^{th}$ stage of logic gates, the input glitch width of each stage of logic gate is larger than or equal to 5 ps and less than 50 ps, and the glitch scaler 20 scales each input glitch width with the scaling factor 0.9 to obtain the corresponding output glitch width. For example, in the $1^{st}$ stage of the logic gate, the input glitch width 41 ps is between 5 ps (TH_L) and 50 ps (TH_H), and the glitch scaler 20 scales the input glitch width 41 ps with the scaling factor 0.9 to obtain the output glitch width 36.9 ps. Next, the glitch width 36.9 ps is provided to the $2^{nd}$ stage of logic gate. In the $2^{nd}$ stage of the logic gate, the input glitch width 36.9 ps is between 5 ps and 50 ps, and the glitch scaler 20 scales the input glitch width 36.9 ps with the scaling factor 0.9 to obtain the output glitch width 33.2 ps, and so on. In the $N^{th}$ stage of the logic gate, assuming that the input glitch width 5 ps is equal to the threshold width TH_L, and the glitch scaler 20 scales the input glitch width 5 ps with the scaling factor 0.9 to obtain the output glitch width 4.5 ps. Next, the glitch width 4.5 ps is provided to the $(N+1)^{th}$ stage of logic gate. In the $(N+1)^{th}$ stage of the logic gate, the input glitch width 4.5 ps is less than 5 ps, and the glitch scaler 20 scales the input glitch width 4.5 ps with the scaling factor 0, thus no output glitch width is generated. Therefore, for the stages following the $(N+1)^{th}$ stage of the logic gate in the multiple-stage chain, no input glitch width is present in the input of the stages of the logic gates.

Figure 8:
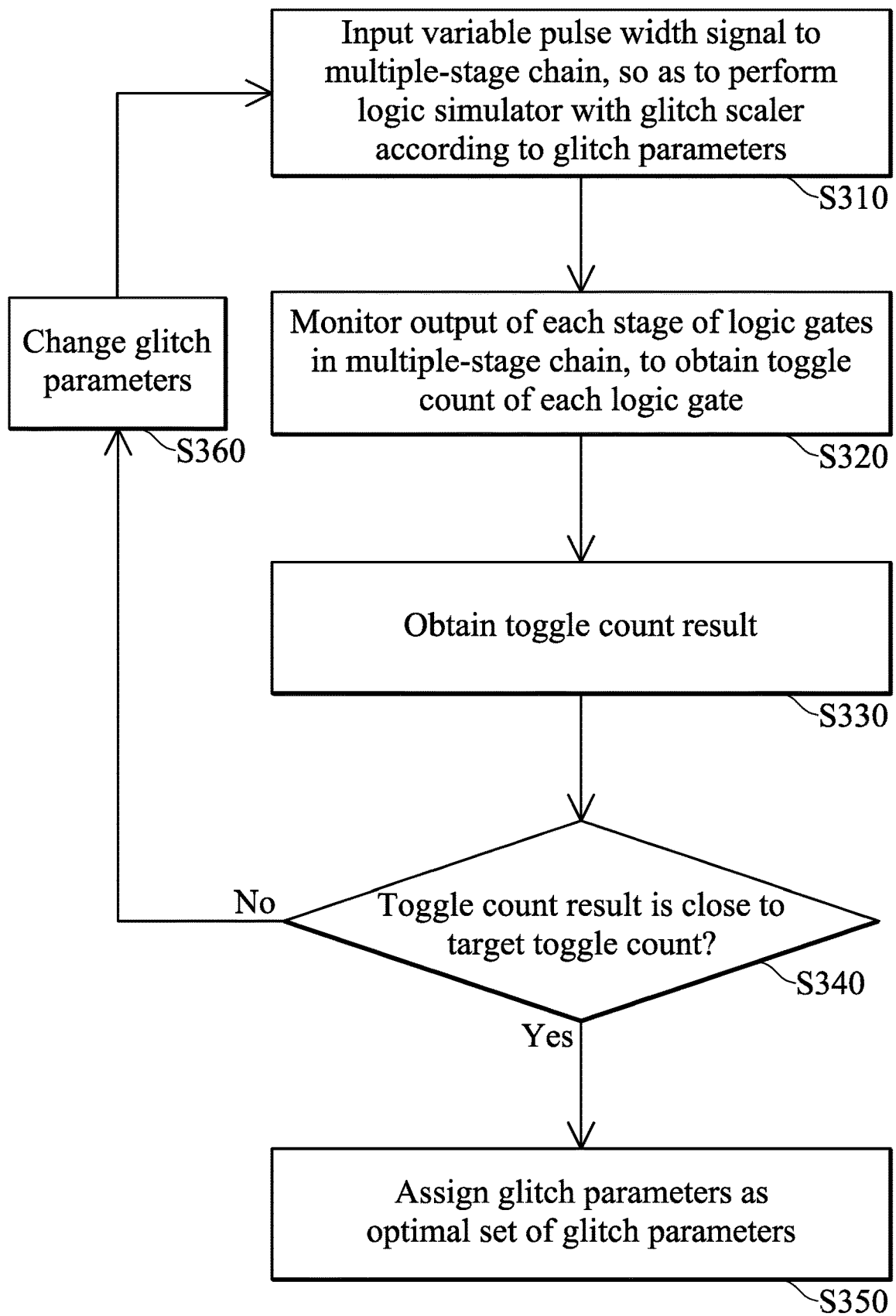
FIG. 8 shows a flowchart of a method for obtaining a set of glitch parameters for modeling glitch of a logic gate according to an embodiment of the invention, wherein the method of FIG. 8 is performed by a computer capable of operating an electronic design automation (EDA) tool.

FIG. 8 shows a flowchart of a method for obtaining a set of glitch parameters for modeling glitch of a logic gate according to an embodiment of the invention, wherein the method of FIG. 8 is performed by a computer capable of operating an electronic design automation (EDA) tool.

First, in step S310, a variable pulse width signal $S_{VPW}$ is input to a multiple-stage chain, so as to perform a logic simulator with a glitch scaler according to a first set of glitch parameters (e.g., the threshold widths and the scaling factors). The multiple-stage chain is formed by a plurality of identical logic gates coupled in a chain, as shown in FIG. 9.

Figure 9:
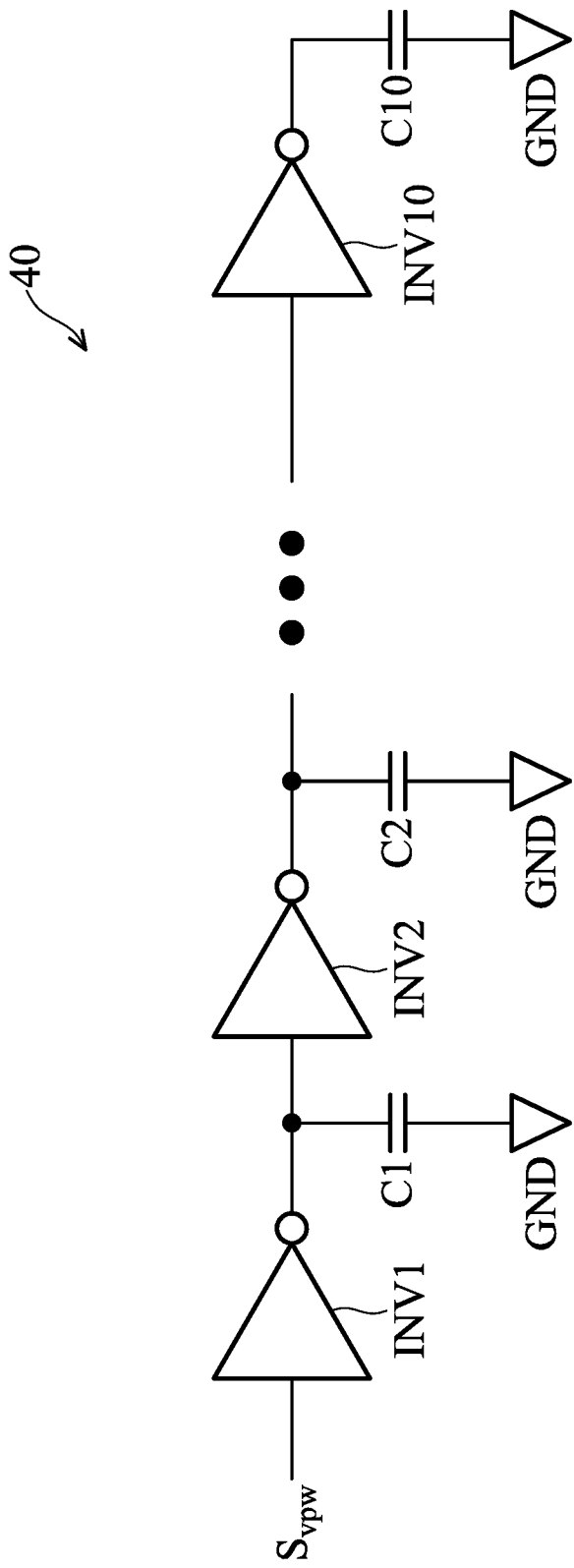
FIG. 9 shows an example illustrating a multiple-stage chain according to an embodiment of the invention.

FIG. 9 shows an example illustrating a multiple-stage chain 40 according to an embodiment of the invention. The multiple-stage chain 40 is formed by 10 inverters INV1-INV10 coupled in a chain, and the inverters INV1-INV10 are identical. For example, an output terminal of the inverter INV1 is coupled to an input terminal of the inverter INV2. Furthermore, a capacitor C1 is coupled between a ground GND and a node between the inverters INV1 and INV2, and the capacitor C1 may be a parasitic capacitor between the inverters INV1 and INV2.

FIG. 10A shows a waveform of the variable pulse width signal $S_{VPW}$ according to an embodiment of the invention. The variable pulse width signal $S_{VPW}$ has a fixed period PT. Furthermore, in the variable pulse width signal $S_{VPW}$, the pulse width is gradually increased from WP1 to WPn according to an interval, and then the pulse width is gradually decreased from WPn to WP1 according to the interval.

FIG. 10B shows a waveform of the variable pulse width signal $S_{VPW}$ according to another embodiment of the invention. The variable pulse width signal $S_{VPW}$ has a fixed period PT. Furthermore, in the variable pulse width signal $S_{VPW}$, the pulse width is gradually decreased from WPn to WP1 according to an interval, and then the pulse width is increased from WP1 to WPn according to the interval.

Referring back to the flowchart of FIG. 8, in step S320, when the variable pulse width signal $S_{VPW}$ is input the multiple-stage chain, the output of each stage of logic gates is monitored, so as to count toggle in the output of each logic gate. The toggle represents the level variation in a signal, for example, a high logic level is changed to a low logic level or a low logic level is changed to a high logic level. Thus, toggle count of each logic gate in the multiple-stage chain is obtained.

In step S330, a toggle count result is obtained according to the toggle counts of the logic gates. In some embodiments, the toggle count result comprises a total toggle count corresponding to the first set of glitch parameters that is obtained by summing the toggle counts of the logic gates. In some embodiments, a total toggle count is obtained by summing the toggle counts of the logic gates in the multiple-stage chain with a plurality of weights. In some embodiments, each logic gate has individual weight. In some embodiments, the toggle count result comprises the toggle count of a specific stage in the multiple-stage chain.

In step S340, it is determined whether the toggle count result corresponding to the first set of glitch parameters is close to a target toggle count. In some embodiments, the target toggle count includes a target total toggle count that is obtained by performing a circuit simulation on the multiple-stage chain in response to the variable pulse width signal $S_{VPW}$, obtaining the target toggle count at the output of each logic gate of the multiple-stage chain, and summing the target toggle counts.

If the toggle count result corresponding to the first set of glitch parameters is close to the target toggle count (e.g., the total toggle count is close to the target total toggle count), the first set of glitch parameters is assigned as an optimal set of glitch parameters for modeling the glitch by the glitch scaler (S350). Thus, the glitch scaler can use the optimal set of glitch parameters to perform the method of FIG. 4.

In a logic simulation, by using the glitch scaler to model the glitch for each logic gate of the circuits in an IC according to the optimal set of glitch parameters, the functional correctness and power estimation of the circuits will be more accurate, for example, similar to analog circuit behavior. As described above, after the functions of the logic gates are verified, a plurality of standard cells corresponding to the logic gates are placed to obtain a layout of the IC, and the IC is fabricated based on the layout of the IC. Furthermore, the power miscorrelation issue between pre-silicon simulation (e.g., a post-simulation of the IC) and real silicon measurement on the fabricated IC is decreased.

If the toggle count result corresponding to the first set of glitch parameters is not close to the target toggle count (e.g., the total toggle count is distant from the target total toggle count), the first set of glitch parameters is adjusted to obtain a second set of glitch parameters (step S360).

In response to the second set of glitch parameters, the step 310 is performed, the variable pulse width signal $S_{VPW}$ is input to the multiple-stage chain, so as to perform a logic simulator with a glitch scaler according to the second set of glitch parameters, and then the output of each stage of logic gates is monitored, so as to count toggle status in the output of each logic gate toggle (step S320).

In step S330, a toggle count result corresponding to the second set of glitch parameters is obtained. Next, it is determined whether the toggle count result corresponding to the second set of glitch parameters is close to the target toggle count (step S340). If the toggle count result corresponding to the second set of glitch parameters is close to the target toggle count, the second set of glitch parameters is assigned as the optimal set of glitch parameters, and the method of FIG. 8 is completed. If the toggle count result corresponding to the second set of glitch parameters is not close to the target toggle count, the second set of glitch parameters is adjusted to obtain a new set of glitch parameters, and the method of FIG. 8 is performed again until the optimal set of glitch parameters is obtained.

Figure 11:
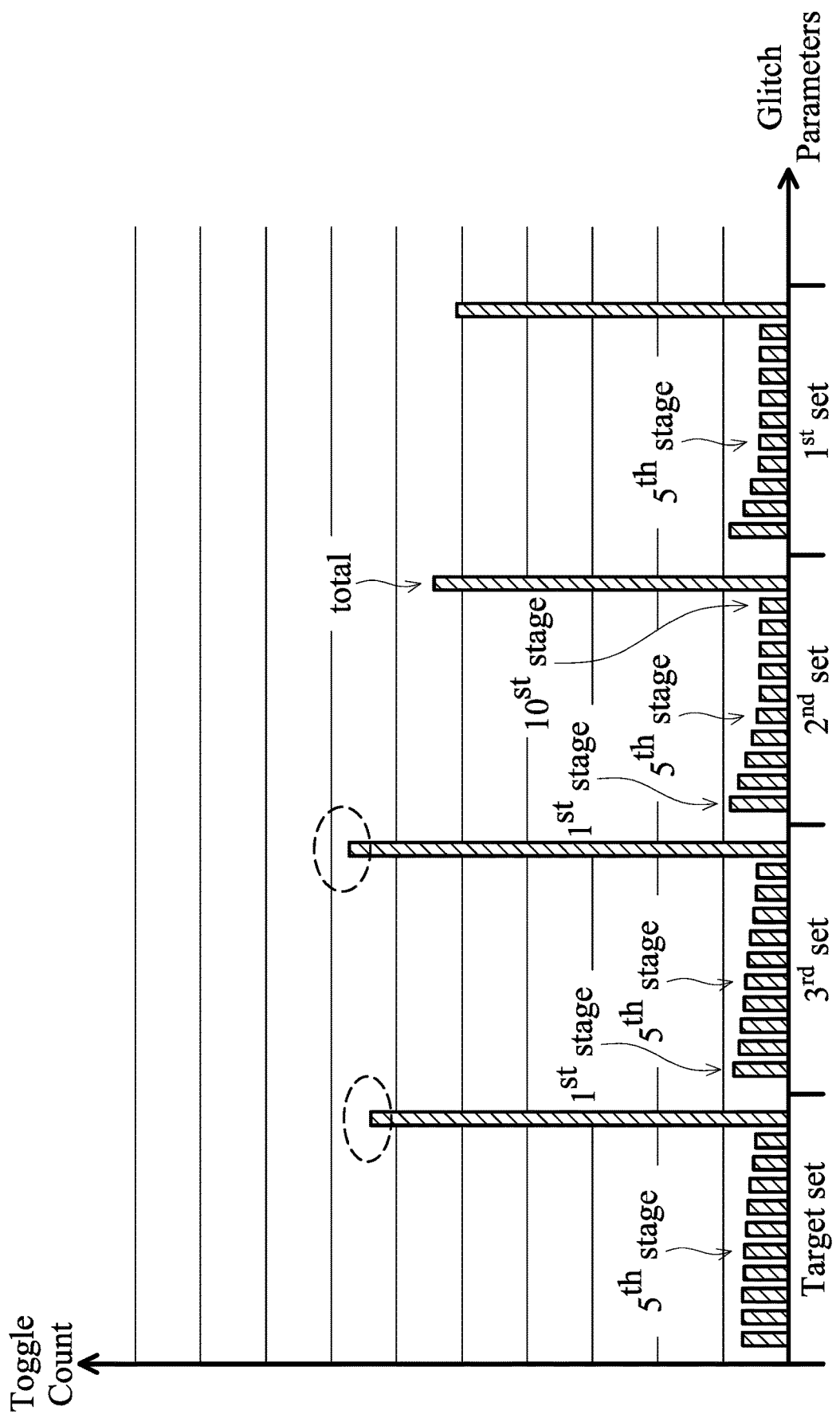
FIG. 11 shows a schematic illustrating the toggle counts of various sets of glitch parameters according to an embodiment of the invention.

FIG. 11 shows a schematic illustrating the toggle counts of various sets of glitch parameters according to an embodiment of the invention. FIG. 11 shows that there are 11 toggle counts in each of the target sets of glitch parameters (i.e. the first set of glitch parameters, the second set of glitch parameters, and the third set of glitch parameters). Using the second set of glitch parameters as an example, the 11 toggle counts comprise the 10 toggle counts of the 10 stages of logic gates and the total toggle count obtained by summing the 10 toggle counts.

The 11 toggle counts of the first, second and third sets of glitch parameters are obtained by inputting the same variable pulse width signal $S_{VPW}$ into a multiple-stage chain formed by a plurality of logic gates coupled in a chain with the corresponding glitch parameters. In this embodiment, the number of logic gates in the multiple-stage chain is 10. In some embodiments, the number of logic gates in the multiple-stage chain is determined by the type of logic gate and the process parameters.

The toggle counts of the first set of glitch parameters are obtained by inputting the same variable pulse width signal $S_{VPW}$ into the multiple-stage chain, and a logic simulation is performed on the logic gates of the multiple-stage chain according to the first set of glitch parameters. Furthermore, the toggle counts of the second set of glitch parameters are obtained by inputting the same variable pulse width signal $S_{VPW}$ into the multiple-stage chain, and a logic simulation is performed on the logic gates of the multiple-stage chain according to the second set of glitch parameters. It should be noted that at least one threshold width or scaling factor between the first, second and third sets of glitch parameters are different.

In FIG. 11, the target toggle counts of the target set of glitch parameters are obtained by performing a circuit simulation on the multiple-stage chain in response to the variable pulse width signal $S_{VPW}$.

In some embodiments, the total toggle counts of the first, second and third set of glitch parameters are obtained in advance, and the optimal set of the glitch parameters is selected from the first, second and third set of glitch parameters.

In FIG. 11, the total toggle count of the third set of glitch parameters is close to the target total toggle count, thus the third set of glitch parameters is the optimal set of glitch parameters for the glitch scaler. Furthermore, for the third set of glitch parameters, the toggle count of tenth logic gate is less than the toggle count of fifth logic gate, and the toggle count of fifth logic gate is less than the toggle count of first logic gate. Therefore, the toggle count of each stage is gradually decreasing in the multiple-stage chain, that matches the analog behave of the target toggle counts.

In some embodiments, the optimal set of glitch parameters is obtained when the toggle count of a specific stage is close to the target toggle count of the same stage. For example, if the toggle count of fifth stage in the third set of glitch parameters is close to the target toggle count of fifth stage in the target set of glitch parameters, the third set of glitch parameters is the optimal set of glitch parameters for the glitch scaler.

In some embodiments, the optimal set of glitch parameters is obtained by summing the toggle counts of the logic gates in the multiple-stage chain with a plurality of weights. In some embodiments, each logic gate has individual weight.

A glitch scaler is used to model glitches in a logic simulation tool, so as to mimic the glitch decaying effect as observed in the circuit simulation, thereby improving the glitch power estimation accuracy. Furthermore, the glitch scaler can be implemented in a logic simulator, an emulator, and other timing/power tools. By modeling glitch decaying effect, better glitch power accuracy and power correlation can be achieved without a circuit simulation, thereby decreasing runtime. Furthermore, each type of logic gate can be assigned individual glitch parameters, thus extending the variables to approach circuit response for better accuracy. The optimal set of glitch parameters of the logic gate can be shared in various designs using similar process technologies.

Figure 12:
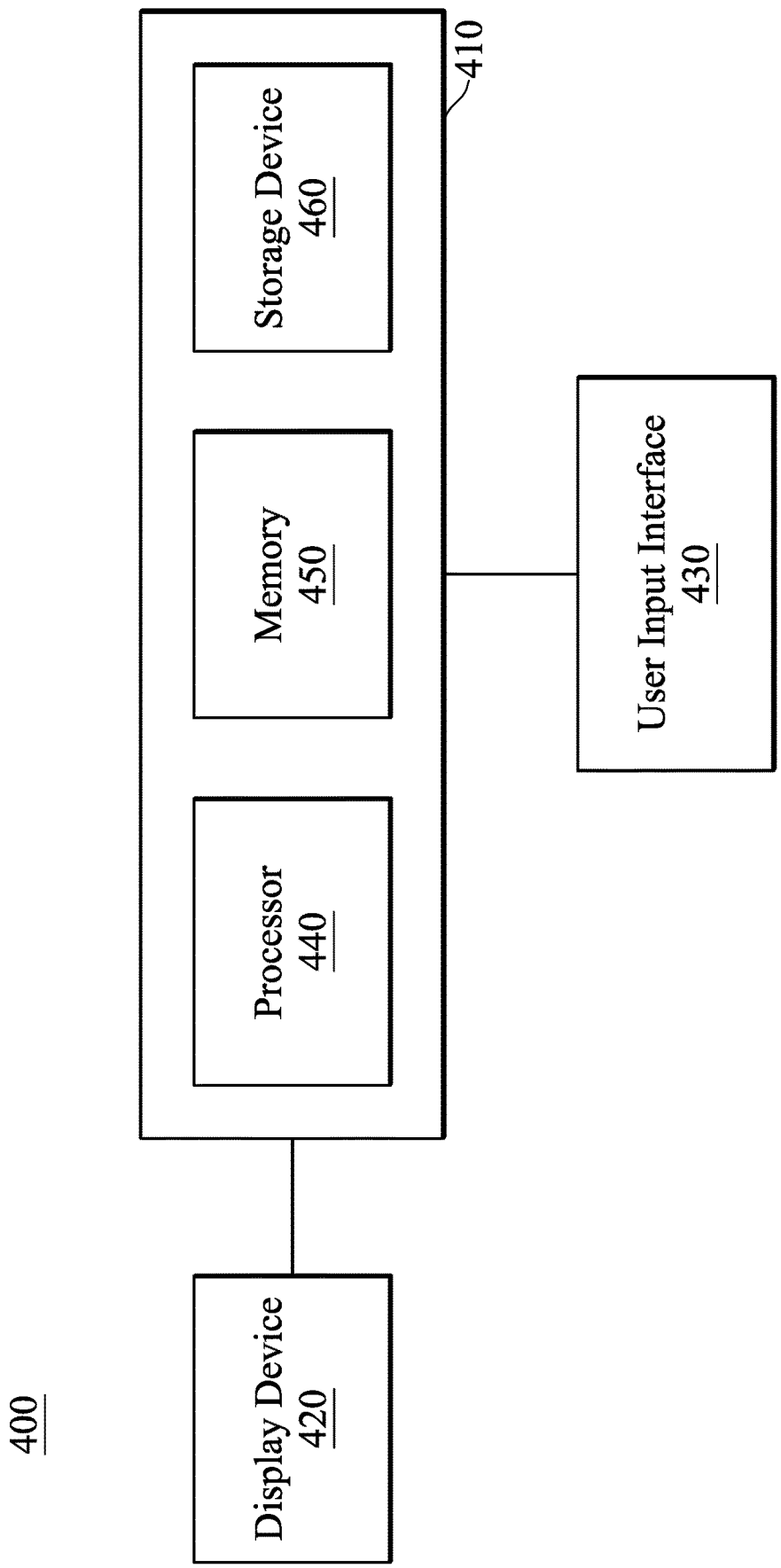
FIG. 12 shows a computer system according to an embodiment of the invention.

FIG. 12 shows a computer system 400 according to an embodiment of the invention. The computer system 400 comprises a computer 410, a display device 420 and a user input interface 430, wherein the computer 410 comprises a processor 440, a memory 450, and a storage device 460. The computer 410 is coupled to the display device 420 and the user input interface 430, wherein the computer 410 is capable of operating an electronic design automation (EDA) tool. Furthermore, the computer 410 is capable of receiving input instructions or information (e.g. timing constraints, RTL code, or interface information of the memory device) from the user input interface 430 and displaying simulation results (e.g., the toggle counts), the layout of the IC and the blocks or circuits of the layout on the display device 420. In one embodiment, the display device 420 is a GUI for the computer 410. Furthermore, the display device 420 and the user input interface 430 can be implemented in the computer 410. The user input interface 430 may be a keyboard, a mouse, and so on. In the computer 410, the storage device 460 can store the operating systems (OSs), applications, information (e.g. circuit function information and power-related information) and data that comprise input required by the applications and/or output generated by applications. The processor 440 of the computer 410 can perform one or more operations (either automatically or with user input) in any method that is implicitly or explicitly described in this disclosure. For example, during an operation, the processor 440 can load the applications of the storage device 460 into the memory 450, and then the applications can be used by the user to create, view, and/or edit a placement, a floor plan and a physical layout for a circuit design.

The data structures and code described in this disclosure can be partially or fully stored on a computer-readable storage medium and/or a hardware module and/or hardware apparatus. A computer-readable storage medium may be, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Examples of hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for modeling glitch of a logic gate, comprising:
  obtaining an input glitch with a glitch width from the logic gate;
  generating a scaled glitch width by scaling the glitch width by a first scaling factor when the glitch width is greater than or equal to a first threshold width and scaling the glitch width by a second scaling factor when the glitch width is less than the first threshold width and greater than or equal to a second threshold width; and
  providing an output glitch with the scaled glitch width for the logic gate,
  wherein the scaled glitch width is greater than 0,
  wherein the first threshold width is greater than the second threshold width, and the second scaling factor is smaller than the first scaling factor.

2. The method as claimed in claim 1, further comprising:
  scaling the glitch width by a third scaling factor when the glitch width is less than the second threshold width,
  wherein the third scaling factor is smaller than the second scaling factor.

3. The method as claimed in claim 2, wherein the third scaling factor is equal to 0.

4. The method as claimed in claim 1, wherein the second threshold width is equal to a cell delay of the logic gate.

5. The method as claimed in claim 1, further comprising:
  placing a plurality of standard cells corresponding to the logic gate in an integrated circuit (IC), to provide a layout of the IC; and
  fabricating the integrated circuit based on the layout of the IC.

6. A method for modeling glitch for a logic gate, comprising:
  obtaining a glitch from an input of the logic gate;
  fully propagating the glitch to an output of the logic gate when a glitch width of the glitch is greater than or equal to a first threshold width;
  filtering out the glitch at the output of the logic gate when the glitch width of the glitch is less than a second threshold width; and
  decreasing the glitch at the output of the logic gate when the glitch width of the glitch is less than the first threshold width and greater than or equal to the second threshold width.

7. The method as claimed in claim 6, wherein the step of decreasing the glitch at the output of the logic gate when the glitch width of the glitch is less than the first threshold width and greater than or equal to the second threshold width further comprises:
  scaling the glitch width of the glitch by a scaling factor when the glitch width of the glitch is less than the first threshold width and greater than or equal to the second threshold width.

8. The method as claimed in claim 7, wherein the scaling factor is smaller than 1 and greater than 0.

9. The method as claimed in claim 6, wherein the second threshold width is equal to a cell delay of the logic gate.

10. The method as claimed in claim 6, further comprising:
  placing a plurality of standard cells corresponding to the logic gate in an integrated circuit (IC), to provide a layout of the IC; and
  fabricating the integrated circuit based on the layout of the IC.

* * * * *